(12) United States Patent
Schoenecker et al.

(10) Patent No.: US 8,373,136 B2
(45) Date of Patent: Feb. 12, 2013

(54) ACHROMATIC BEAM DEFLECTOR, ACHROMATIC BEAM SEPARATOR, CHARGED PARTICLE DEVICE, METHOD OF OPERATING AN ACHROMATIC BEAM DEFLECTOR, AND METHOD OF OPERATING AN ACHROMATIC BEAM SEPARATOR

(75) Inventors: Gerald Schoenecker, Munich (DE); Stefan Lanio, Erding (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 40 days.

(21) Appl. No.: 12/579,869

(22) Filed: Oct. 15, 2009

(65) Prior Publication Data

US 2011/0089322 A1 Apr. 21, 2011

(51) Int. Cl.
*H01J 3/18* (2006.01)
*H01J 3/20* (2006.01)

(52) U.S. Cl. ............... 250/396 R; 250/397; 250/398

(58) Field of Classification Search ... 250/396 R–396 ML
See application file for complete search history.

(56) References Cited

U.S. PATENT DOCUMENTS

| | | | |
|---|---|---|---|
| 5,825,123 A | 10/1998 | Retsky | |
| 6,489,621 B1 | 12/2002 | Frosien | |
| 6,509,569 B1 | 1/2003 | Frosien | |
| 6,614,151 B2 | 9/2003 | Retsky | |
| 7,164,139 B1 * | 1/2007 | Toth et al. | 250/396 ML |
| 7,335,894 B2 | 2/2008 | Frosien et al. | |
| 2006/0219935 A1 * | 10/2006 | Henstra | 250/396 ML |
| 2008/0185514 A1 * | 8/2008 | Frosien et al. | 250/288 |
| 2008/0283749 A1 * | 11/2008 | Muller et al. | 250/311 |

FOREIGN PATENT DOCUMENTS

| | | |
|---|---|---|
| EP | 0097535 A2 | 1/1984 |
| EP | 1100111 B1 | 10/2002 |
| EP | 1521289 B1 | 6/2008 |
| EP | 1956630 A1 | 8/2008 |
| JP | 2002231168 A | 8/2002 |
| WO | WO-2008/101713 | 8/2008 |
| WO | WO-2008/101714 | 8/2008 |

OTHER PUBLICATIONS

Extended European Search Report dated Mar. 19, 2010 for European Patent Application No. 09173111.7.

* cited by examiner

*Primary Examiner* — Robert Kim
*Assistant Examiner* — David E Smith
(74) *Attorney, Agent, or Firm* — Patterson & Sheridan, LLP (57) ABSTRACT

An achromatic beam separator device for separating a primary charged particle beam from another charged particle beam and providing the primary charged particle beam on an optical axis (142) is provided, including a primary charged particle beam inlet (134), a primary charged particle beam outlet (132) encompassing the optical axis, a magnetic deflection element (163) adapted to generate a magnetic field, and an electrostatic deflection element (165) adapted to generate an electric field overlapping the magnetic field, wherein at least one element chosen from the electrostatic deflection element and the magnetic deflection element is positioned and/or positionable to compensate an octopole influence.

22 Claims, 8 Drawing Sheets

FIG 3A
E shift= +0mm

YZ-Section  25.000 mm  2.500 mm

FIG 3B
E shift= +0mm

FIG 3C

FIG 4A
E shift=-5 mm

YZ-Section    25.000 mm    2.500 mm

FIG 4B
E shift=-5 mm

FIG 5A

E shift = +0.2 mm

FIG 5B

E shift = +0,2mm

ACHROMATIC BEAM DEFLECTOR, ACHROMATIC BEAM SEPARATOR, CHARGED PARTICLE DEVICE, METHOD OF OPERATING AN ACHROMATIC BEAM DEFLECTOR, AND METHOD OF OPERATING AN ACHROMATIC BEAM SEPARATOR

TECHNICAL FIELD

The present invention relates to an achromatic beam deflector device, an achromatic beam separator device, a charged particle beam device, a method of operating an achromatic beam deflector device, and a method of operating an achromatic beam separator device. More specifically, embodiments relate to an optimized design of an achromatic beam separator with minimized aberrations.

BACKGROUND ART

A modern semiconductor device is composed of approximately 20-30 pattern layers that collectively implement the intended functionality of the designer. In general, the designer describes the chip functionality with high level, behavior design languages like VHDL, and then a series of EDA tools translate the high-level description into a GDSII file. The GDSII file contains a geometrical description of polygons and other shapes that describe the patterns of the different layers. The GDSII file accompanied with process design rules for the fabrication process to be used to make the device describes the intended geometry on the layout with the relevant tolerances.

Modern photolithography presents several challenges, including those associated with moving from 90 nm to 45 nm and 32 nm while keeping the stepper wavelengths at e.g. 193 nm. This requires further transformation of the intended layout geometry to a post resolution enhancement technique (RET) version of the GDSII file. The new GDSII file includes pattern modifications for optical proximity corrections (OPC) and mask technology. The complex set of OPC corrections, mask-making and stepper conditions is required to print the intended geometry on the wafer.

In light of the above, semiconductor technologies have created a high demand for structuring and probing specimens within the nanometer scale. Micrometer and nanometer scale process control, inspection or structuring, is often done with charged particle beams. Probing or structuring is often performed with charged particle beams which are generated and focused in charged particle beam devices. Examples of charged particle beam devices are electron microscopes, electron beam pattern generators, ion microscopes as well as ion beam pattern generators. Charged particle beams, in particular electron beams, offer superior spatial resolution compared to photon beams, due to their short wavelengths at comparable particle energy.

Particle optics apparatuses like, e.g. Scanning Electron Microscopes (SEM), generate a primary beam illuminating or scanning a specimen. For instance in case of an SEM, the primary electron (PE) beam generates particles like secondary electrons (SE) and/or backscattered electrons (BSE) that can be used to image and analyze the specimen. Many instruments use either electrostatic or compound electric-magnetic lenses to focus the primary beam onto the specimen. In some cases, the electrostatic field simultaneously collects the generated particles (SE and BSE) which are entering into the lens and must be guided onto a detector. This detector may be concentric to the PE axis, but this concept may result in signal loss due to the detector hole. If uniform high efficiency electron collection and detection is required, the secondary and/or backscattered particles must be separated from the primary beam, e.g. by a beam separator including magnetic deflection fields or a Wien filter element.

Both types of beam separator introduce dispersion of the primary beam and finally limit the attainable resolution. One type of Wien filter, an unbalanced type known as "achromatic Wien filter" can be used to avoid PE beam dispersion. However, these devices typically result in aberrations which can impair spot size and the spot resolution in e.g. high speed Electron Beam Inspection applications using large beam currents and beam diameters.

SUMMARY

In light of the above, an achromatic beam deflector device according to claim 1, an achromatic beam separator device according to claim 2, a charged particle beam device according to claim 9, a method of operating an achromatic beam deflector device according to claim 12, a method of operating an achromatic beam separator device according to claim 13, and a use according to claim 16 are provided.

One embodiment provides an achromatic beam deflector device for deflecting a primary charged particle beam and providing the primary charged particle beam on an optical axis, including a primary charged particle beam inlet, a primary charged particle beam outlet encompassing the optical axis, a magnetic deflection element adapted to generate a magnetic field, and an electrostatic deflection element adapted to generate an electric field overlapping the magnetic field, wherein at least one element chosen from the electrostatic deflection element and the magnetic deflection element is positioned and/or positionable to compensate an octopole influence.

In another embodiment, an achromatic beam separator device for separating a primary charged particle beam from another charged particle beam and providing the primary charged particle beam on an optical axis includes a primary charged particle beam inlet, a primary charged particle beam outlet encompassing the optical axis, a magnetic deflection element adapted to generate a magnetic field, and an electrostatic deflection element adapted to generate an electric field overlapping the magnetic field, wherein at least one element chosen from the electrostatic deflection element and the magnetic deflection element is positioned and/or positionable to compensate an octopole influence.

According to a further embodiment, a charged particle beam device is provided, including at least one element chosen from an achromatic beam deflector device and an achromatic beam separator device according to any of above embodiments.

In another embodiment, a method of operating an achromatic beam deflector device for deflecting a primary charged particle beam and providing the primary charged particle beam on an optical axis is provided, the method including providing a magnetic field, providing an electric field overlapping the magnetic field, wherein at least one element chosen from the electric field and the magnetic field is provided in a position to compensate an octopole influence.

According to one embodiment, a method of operating an achromatic beam separator device for separating a primary charged particle beam from another charged particle beam and providing the primary charged particle beam on an optical axis includes providing a magnetic field, providing an electric field overlapping the magnetic field, wherein at least one element chosen from the electric field and the magnetic field is provided in a position to compensate an octopole influence.

According to a further embodiment, at least one element chosen from above achromatic beam deflector device, above achromatic beam separator device, and above charged particle beam device is used in a method of probing and/or structuring of a specimen.

Further features and details are evident from the dependent claims, the description and the drawings.

Embodiments are also directed to apparatuses for carrying out the disclosed methods and including apparatus parts for performing described method steps. Furthermore, embodiments are also directed to methods by which the described apparatus operates or by which the described apparatus is manufactured. It may include method steps for carrying out functions of the apparatus or manufacturing parts of the apparatus. The method steps may be performed by way of hardware components, firmware, software, a computer programmed by appropriate software, by any combination thereof or in any other manner.

BRIEF DESCRIPTION OF THE DRAWINGS

So that the manner in which the above recited features of embodiments can be understood in detail, a more particular description of embodiments of the invention, briefly summarized above, may be had by reference to examples of embodiments. The accompanying drawings relate to embodiments of the invention and are described in the following. Some of the above mentioned embodiments will be described in more detail in the following description of typical embodiments with reference to the following drawings in which.

It is contemplated that elements of one embodiment may be advantageously utilized in other embodiments without further recitation.

DETAILED DESCRIPTION OF THE DRAWINGS

Reference will now be made in detail to the various embodiments, one ore more examples of which are illustrated in the figures. Each example is provided by way of explanation, and is not meant as a limitation of the invention.

Without limiting the scope of protection, in the following description the charged particle beam device or components thereof will exemplarily be referred to as a charged particle beam device including the detection of secondary electrons. Embodiments described herein can still be applied for apparatuses and components detecting corpuscles such as secondary and/or backscattered charged particles in the form of electrons or ions, photons, X-rays or other signals in order to obtain a specimen image.

Generally, when referring to corpuscles it is to be understood as a light signal, in which the corpuscles are photons, as well as particles or charged particles, in which the corpuscles are ions, atoms, electrons or other particles. Further, in the following, the term "secondary charged particles" includes secondary charged particles created at or in the specimen, and backscattered charged particles. In case of a primary electron beam, the term "secondary electrons" includes secondary electrons (SE), e.g. Auger electrons, and backscattered electrons (BSE).

Further, without limiting the scope, in the following the examples and embodiments of the achromatic beam deflector device and the achromatic beam separator device are described referring to an SEM. Typically, the devices of embodiments described herein include vacuum-compatible materials. Typical applications of embodiments described herein are for example probing and/or structuring of a specimen in solar wafer manufacturing and in semiconductor device production.

In the following and without limiting the scope, the achromatic beam deflector device of embodiments described herein can be used as and is also referred to as an achromatic beam separator device, e.g. when included in an inspection device such as an SEM.

A "specimen" as referred to herein, includes, but is not limited to, semiconductor wafers, semiconductor workpieces, and other workpieces such as memory disks and the like. Embodiments may be applied to any workpiece on which material is deposited, which is inspected or which is structured. A specimen includes a surface to be structured, imaged or on which layers are deposited.

Within the following description of the drawings, the same reference numbers refer to the same components. Generally, only the differences with respect to the individual embodiments are described.

Figure 1:
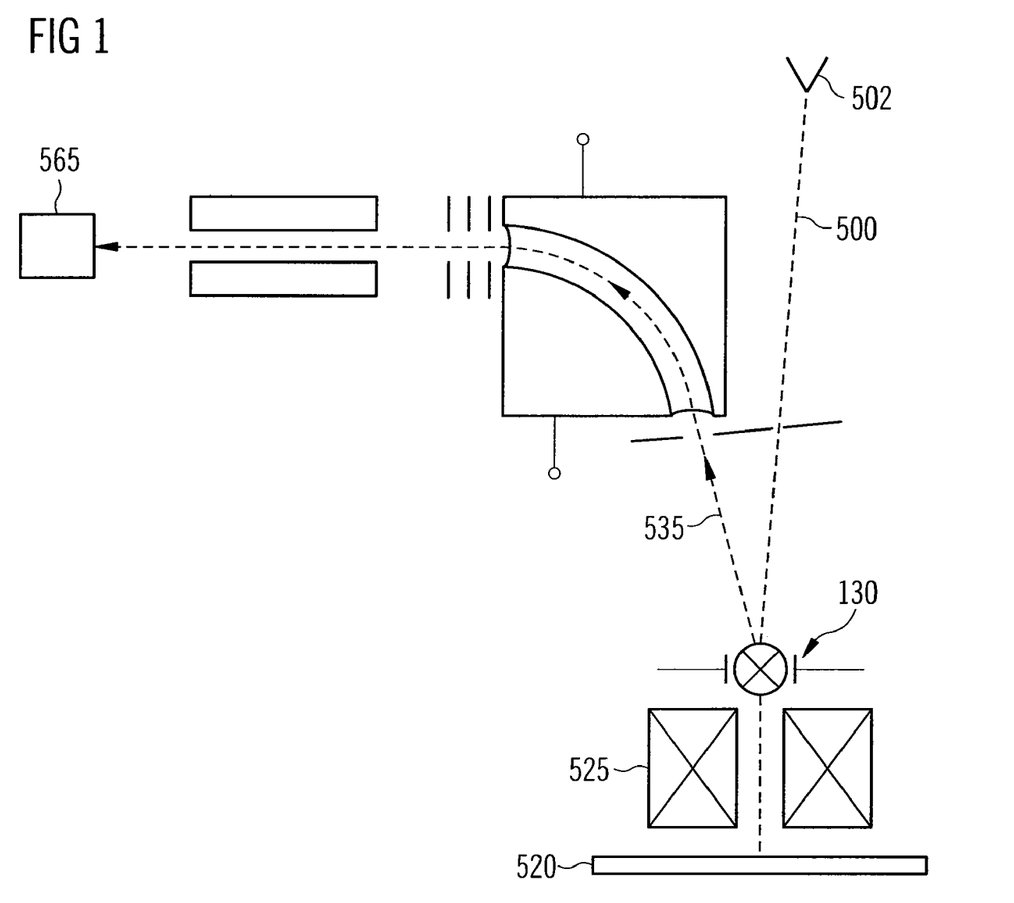
FIG. 1 schematically illustrates a charged particle beam device according to embodiments.

A typical setup of an achromatic beam separator 130 in an electron microscope is shown in FIG. 1. The achromatic beam separator 130 is arranged in front of an objective lens 525. A primary electron beam 500 produced by an emitter 502 enters the beam separator 130 under an angle, is deflected to the objective lens axis, impinges on the specimen 520 and generates secondary electrons, also called herein signal electrons. The secondary electron (SE) beam is extracted into the lens 525, transverses the separator 130 and is deflected to the side, forming a separated SE bundle 535 that travels towards a detector 565.

According to embodiments, which can be combined with any of the embodiments described herein, an achromatic beam separator 130 or an achromatic beam separator 130 having an electrostatic deflection element and a magnetic deflection element can be provided.

Figure 2:
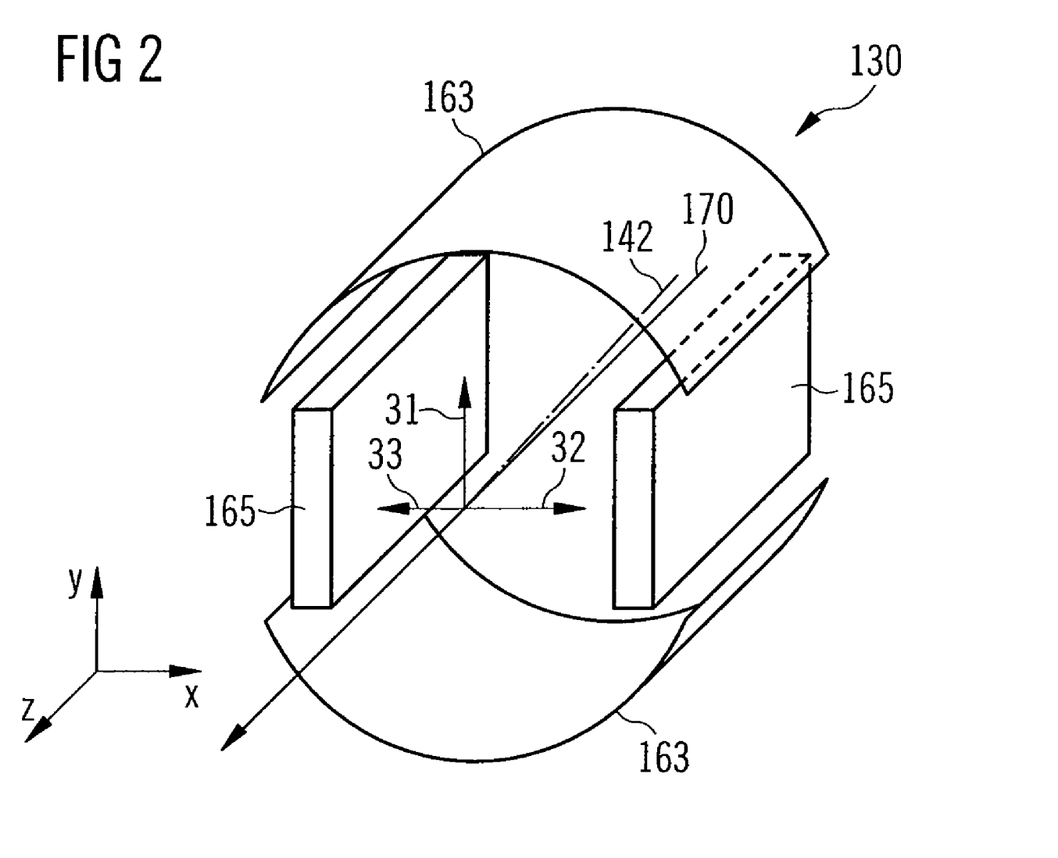
FIG. 2 schematically shows an example of an achromatic beam deflector of embodiments.

FIG. 2 shows an enlarged view of an embodiment of the achromatic beam deflector 130 or achromatic beam separator 130, the latter also called herein achromatic separator, beam splitter or beam separator. Substantially perpendicular static electric and magnetic fields normal to the z-axis 142 (optical axis) are used. The force acting on the electrons is given by the coulomb force $$F_e = q \cdot E \qquad (1)$$

and the Lorentz force $$F_m = q \cdot (v \times B) \qquad (2)$$

The angle of deflection of the electrons in the electric and magnetic fields, both of length l, can be described with the following equation:

$$\theta = ql(vB-E)/(mv^2) \quad (3)$$

FIG. 2 illustrates the achromatic beam deflector 130 or achromatic beam separator 130. Therein, coil windings 163 and plate-shaped electrodes 165 are shown. The coils 163 generate a magnetic field 31. The magnetic field generates a magnetic force 32 for an electron beam 170. The magnetic force is generated according to equation 2. Substantially perpendicular to the magnetic field 31 an electric field is generated between the electrodes 165. Thereby, an electric force 33, which is substantially opposite to the magnetic force, is generated.

The embodiment shown in FIG. 2 generates perpendicular magnetic and electric fields. Within FIG. 2, the path of electron beam 170 is inclined with respect to the axis 142 when the electrons enter the achromatic deflector. The electrons are deflected within the achromatic deflector to travel essentially along the z-axis 142 after trespassing the achromatic deflector. This can be understood in light of the derivative of equation 3, that is $$d\theta/dv = -(qlB/mv^2)(1-2E/vB) \quad (4)$$

The deflection angle is independent of the velocity of the electrons, if the condition that the magnetic force equals twice the electric force is fulfilled. In FIG. 2 this is illustrated by the lengths of the force indicating arrows 32 and 33.

In embodiments described herein, the achromatic beam deflector 130 or achromatic beam separator 130 can be described at least by one of the following features. According to one embodiment, 20 to 100 ampere turns (Aturns), e.g. 50 Aturnes, may be provided, even for applications under increased column voltage or increased deflection angle. According to an even further embodiment, about 10 to 400 coil windings can be provided. Yet according to another embodiment, 50 to 500 coil windings can be provided. Nevertheless, it might be possible to provide even more coil windings, for example, up to a few thousand. Other important parameters are for instance the geometry of the coils, if present the iron core, the beam energy inside the deflector 130 or separator 130, or the deflection angle.

According to an even further embodiment, the achromatic deflection angle can be between about 1° and about 25° for a coarse range. According to another further embodiment, the deflection angle is between about 2° and about 5° for a narrow range.

In the achromatic beam deflector or beam separator shown in FIG. 2, electrostatic deflection is given by:

$$\alpha_e \propto \frac{E_1}{U_A}, U_A \to U_A + \Delta U_A \Rightarrow \delta\alpha \propto -\Delta U_A$$

Further, magnetic deflection is given by:

$$\alpha_m \propto \frac{B_1}{\sqrt{U_A}}, U_A \to U_A + \Delta U_A \Rightarrow \delta\alpha \propto -\frac{1}{2}\Delta U_A$$

If the magnetic deflection equals minus two times the electrostatic deflection, a deflection without chromatic aberration (dispersion) can be realized.

The orthogonal electric and magnetic dipole fields of the beam deflector and beam separator, respectively, are usually generated by devices having a minimum number of pole pieces or excitation coils. By design, the fields can be shaped, such that for instance parasitic hexapole fields can be avoided, e.g. by using 120° saddle coils or by an appropriate shaping of electrodes.

Undesired decapole components of the fields can be avoided, if a large number of poles (N≧10) is provided. However, this would require a complicated mechanical design and sophisticated supply electronics. Therefore, for a beam deflector and beam separator, respectively, a simple design, e.g. a minimum number of poles and associated electronics, is desired, and the existence of a decapole component in simple designs is typically accepted. In some cases of a small PE bundle, a decapole component will not have an undesired effect on the optical performance and/or resolution of the beam deflector and beam separator, respectively.

E.g. for PE beams with high beam current and, consequently, large beam bundle diameters, a decapole component will indirectly act on a PE bundle, which for instance has at least partially an angle of incidence of less than 90°, as long as it travels off axis (z-axis), namely in front of the beam deflector, before it is deflected onto the z-axis. In case of the beam separator being provided in a charged particle beam device, the z-axis may be the optical axis of the objective lens. In this off-axis region, the PE bundle experiences the effect of a decapole field as a variety of different influences: a potential offset, a dipole component, a quadrupole component, a hexapole component, and octopole component and the decapole itself.

According to some embodiments, which can be combined with any other embodiment described herein, a potential offset, a dipole component, and a quadrupole component of the decapole field can be controlled by alignment, refocusing and stigmation, and/or a hexapole component of the decapole field can be controlled e.g. by a hexapole stigmator.

In one embodiment, which can be combined with other embodiments described herein, a 60° angle of saddle coils can reduce or avoid hexapole components. Further, alternatively, a combination of coils with a 42° and 78° angle can reduce or avoid hexapole and decapole components.

One embodiment provides an achromatic beam deflector device for deflecting a primary charged particle beam and providing the primary charged particle beam on an optical axis, including a primary charged particle beam inlet, a primary charged particle beam outlet encompassing the optical axis, a magnetic deflection element adapted to generate a magnetic field, and an electrostatic deflection element adapted to generate an electric field overlapping the magnetic field, wherein at least one element chosen from the electrostatic deflection element and the magnetic deflection element is positioned and/or positionable to compensate an octopole influence, e.g. an octopole influence created by the beam deflector device.

According to one embodiment, an achromatic beam deflector device for deflecting a primary charged particle beam and providing the primary charged particle beam on an optical axis includes: a primary charged particle beam inlet, a primary charged particle beam outlet encompassing the optical axis, a magnetic deflection element generating or being adapted to generate a magnetic field having a centre, and an electrostatic deflection element generating or being adapted to generate an electric field having a centre and overlapping the magnetic field. At least one element chosen from the electrostatic deflection element and the magnetic deflection element is positioned and/or positionable to compensate an octopole influence, e.g. an octopole influence created by the beam deflector device.

In another embodiment, an achromatic beam separator device for separating a primary charged particle beam from another charged particle beam and providing the primary charged particle beam on an optical axis includes: a primary charged particle beam inlet, a primary charged particle beam outlet encompassing the optical axis, a magnetic deflection element adapted to generate a magnetic field, and an electrostatic deflection element adapted to generate an electric field overlapping the magnetic field, wherein at least one element chosen from the electrostatic deflection element and the magnetic deflection element is positioned and/or positionable to compensate an octopole influence, e.g. an octopole influence created by the beam separator device.

In a further embodiment, an achromatic beam separator device for separating a primary charged particle beam from another charged particle beam and providing the primary charged particle beam on an optical axis, includes a primary charged particle beam inlet, a primary charged particle beam outlet encompassing the optical axis, a magnetic deflection element generating or being adapted to generate a magnetic field having a centre, and an electrostatic deflection element generating or being adapted to generate an electric field having a centre and overlapping the magnetic field. At least one element chosen from the electrostatic deflection element and the magnetic deflection element is positioned and/or positionable to compensate an octopole influence, e.g. an octopole influence created by the beam separator device.

In embodiments, at least one element chosen from the electrostatic deflection element and the magnetic deflection element is adapted, e.g. positioned and/or positionable, adjusted and/or adjustable, and/or controlled and/or controllable, to compensate an octopole influence, e.g. an octopole aberration. For instance, according to embodiments, a trajectory of a primary charged particle beam bundle is created that allows the primary charged particle beam to experience an equal amount of positive and negative octopole effect about the optical axis. Thereby, the net effect of the octopole on the primary charged particle beam is substantially zero. The octopole can be an octopole potential and/or an octopole field.

According to embodiments, the electric and magnetic fields can be generated on the optical axis, e.g. encompassing the optical axis. In some embodiments, which can be combined with any other embodiment described herein, the incident primary beam or at least a part thereof can have an angle of incidence of less than 90° into the beam inlet of the beam deflector device or beam separator device. According to embodiments, which can be combined with any other embodiment described herein, the electric field has a centre and/or the magnetic field has a centre. In some embodiments, the electrical field is provided orthogonal to the magnetic field and/or encompassing the magnetic field. Moreover, according to embodiments, the electric field and the magnetic field can be provided substantially perpendicular to each other and/or substantially normal to the optical axis. In further embodiments, which can be combined with any other embodiment described herein, the electrostatic deflection element and the magnetic deflection element are adapted to encompass the optical axis.

Embodiments described herein allow for deflecting a primary charged particle beam, e.g. travelling off-axis of a charge particle beam device, onto an optical axis while avoiding fourfold aberrations. Further, embodiments provide a beam deflector and/or a beam separator, in which fourfold aberrations are avoided or which is even substantially free of fourfold aberrations, such as caused by an octopole potential, e.g. an octopole potential which is created by the beam deflector or beam separator itself. This avoids the need for additional correction elements and the associated control electronics and thus results in a significant simplification and cost reduction of the charged particle beam system.

Figure 3A:
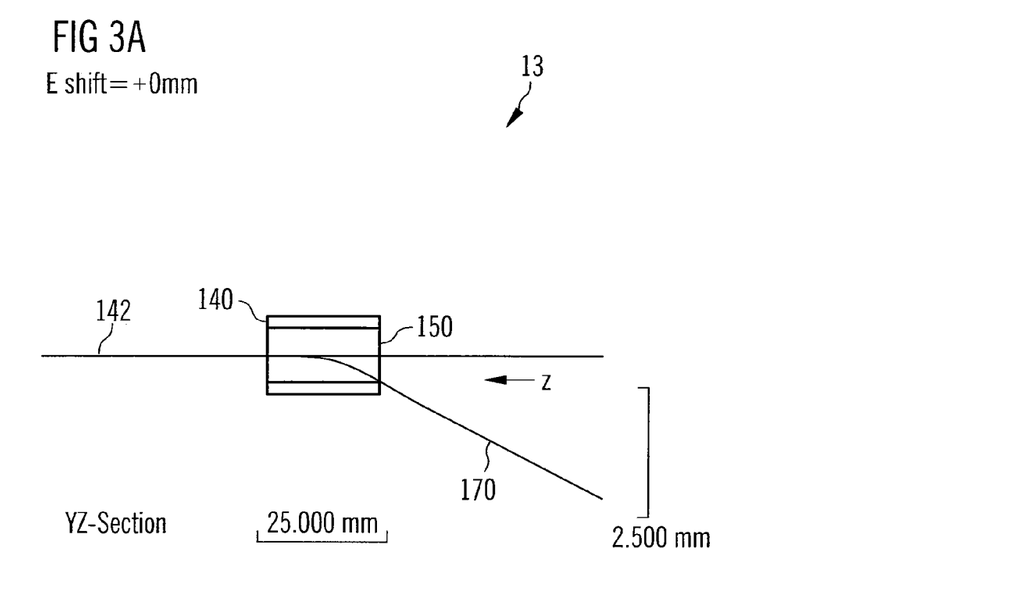
FIGS. 3A to 3C schematically illustrate an achromatic beam splitter, a corresponding beam bundle shape, and an orientation of an octopole created by a beam deflector or a beam separator.
Figure 3B:
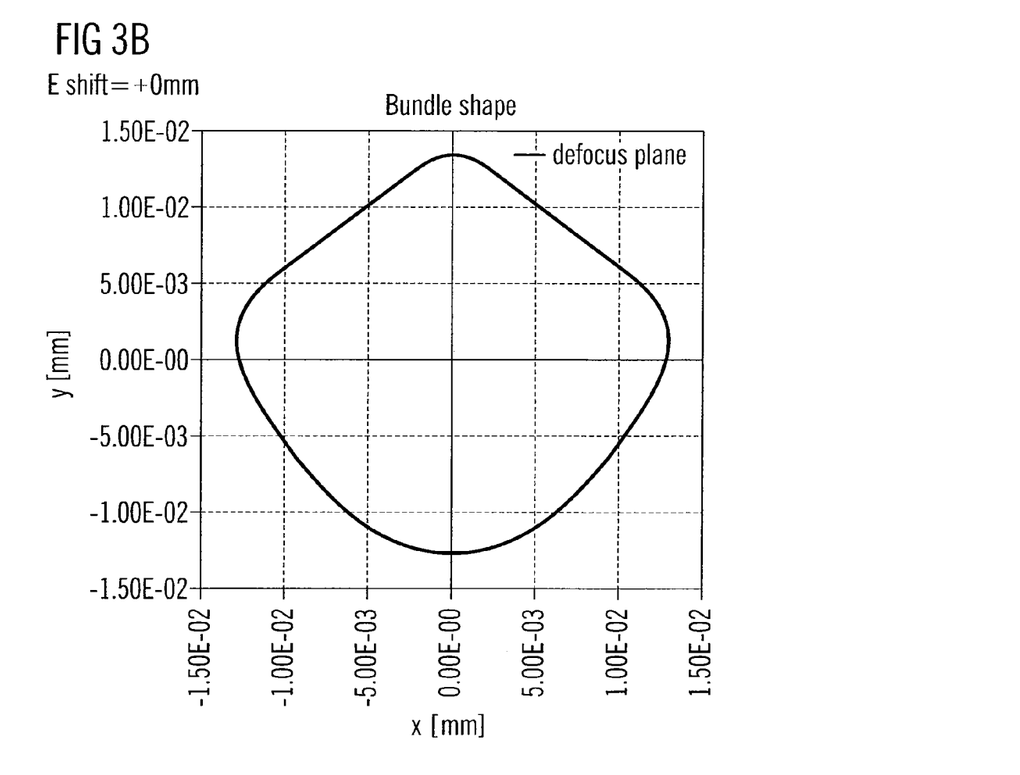

FIGS. 3A to 3B schematically illustrate an electrostatic deflection field 140 and a magnetic deflection field 150, also called herein electric and magnetic field, respectively, and the bundle shape produced by an achromatic beam separator device 13, also called achromatic beam splitter, without an offset of the electric and/or magnetic fields. As shown in FIG. 3A, which is an yz-section of the beam separator, the centres of the electrostatic and magnetic deflection fields substantially coincide. The primary beam 170 is incident into the beam separator 13 with an angle of incidence of less than 90° and is deflected onto the z-axis. The resulting shape of the beam bundle is shown in FIG. 3B, the beam bundle showing a fourfold aberration.

Figure 3C:
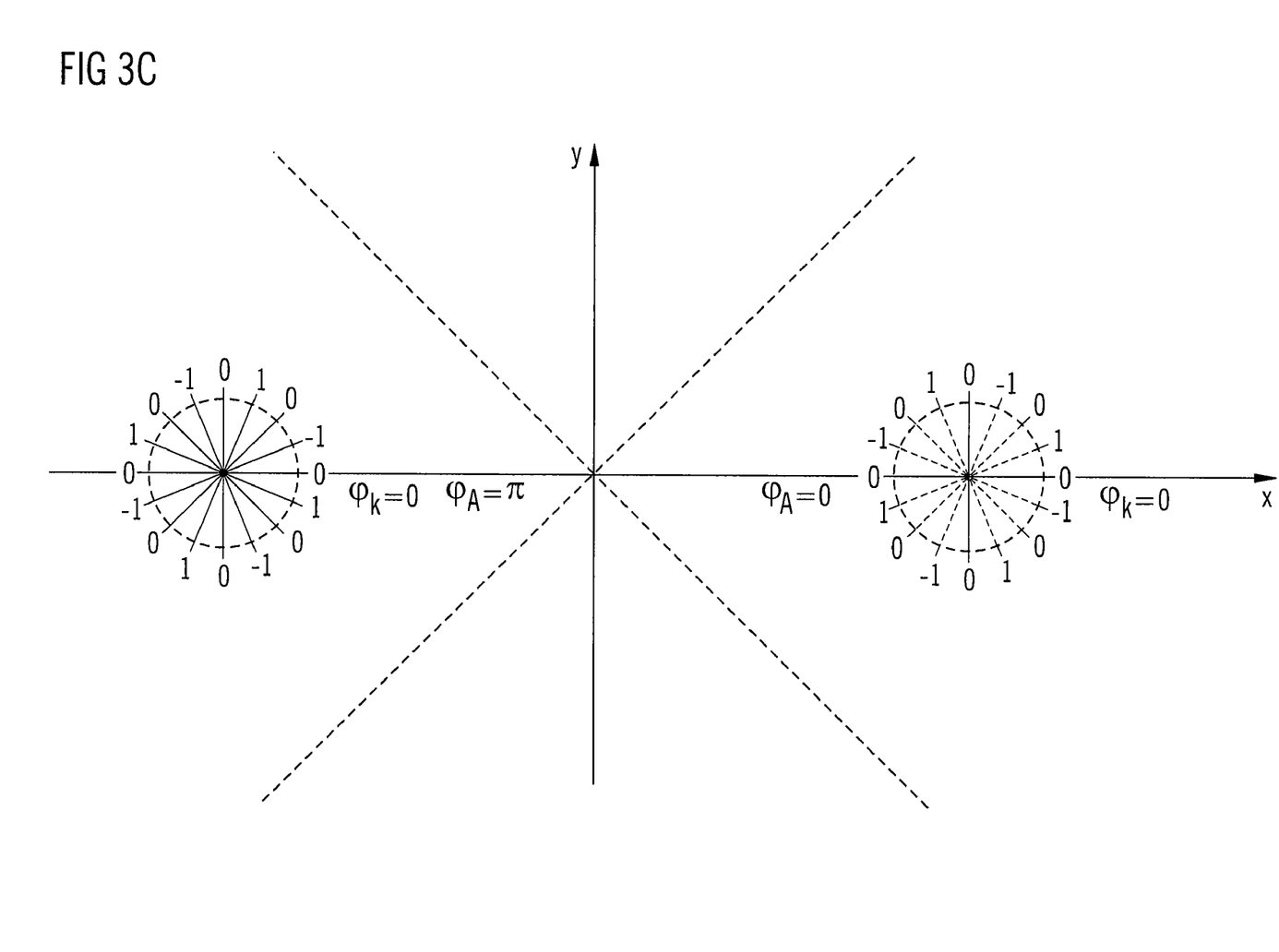

FIG. 3C schematically illustrates how the octopole orientation depends on the position of the intersection point a of the primary beam bundle axis with the decapole potential created by a beam deflector or beam separator. In FIG. 3C, the circles represent the beam bundle and the centre of the bundle represents intersection point a. $\phi_A$ is the azimuth of the axis intersection point $a = Ae^{i\phi_A}$, measured from the x-axis. $\phi_K$ is the azimuth of the beam bundle circumference measured from the horizontal, i.e. in parallel to the x-axis. Both angles $\phi_A$ and $\phi_K$ are zero in x-direction. The achromatic condition of the beam deflector or beam separator establishes a distinct direction of the dipole fields and therefore the direction of the accompanying decapole is also fixed. As can bee seen from FIG. 3C, the octopole polarity switches when going from $\phi_A = 0$ to $\phi_A = \pi$. In FIG. 3C, the deflection direction is chosen as the x-axis and the primary beam bundle approaches the optical axis of the separator element along the x-axis while it is substantially travelling in z-direction perpendicular to the drawing plane. It will experience the deforming forces of the shown octopole potential until it comes sufficient close to the optical z-axis where the octopole effect vanishes.

In some embodiments, at least one element chosen from the electrostatic deflection element and the magnetic deflection element is adapted to provide the electric field and the magnetic field in an arrangement in which the electric field and the magnetic field, e.g. the centre of the electric field and the centre of the magnetic field, are offset with respect to each other. Due to the resulting mechanical spacing between the constituent deflection fields, fourfold aberrations are avoided.

According to some embodiments described herein, the electric field and the magnetic field, e.g. the centre of the electric field and the centre of the magnetic field, are offset with respect to each other in parallel to and/or along the optical axis. The electric field can be offset with respect to the magnetic field in a direction towards the beam outlet. For instance, the centre of the electric field can be offset with respect to the centre of the magnetic field in a direction towards the beam outlet.

Figure 4A:
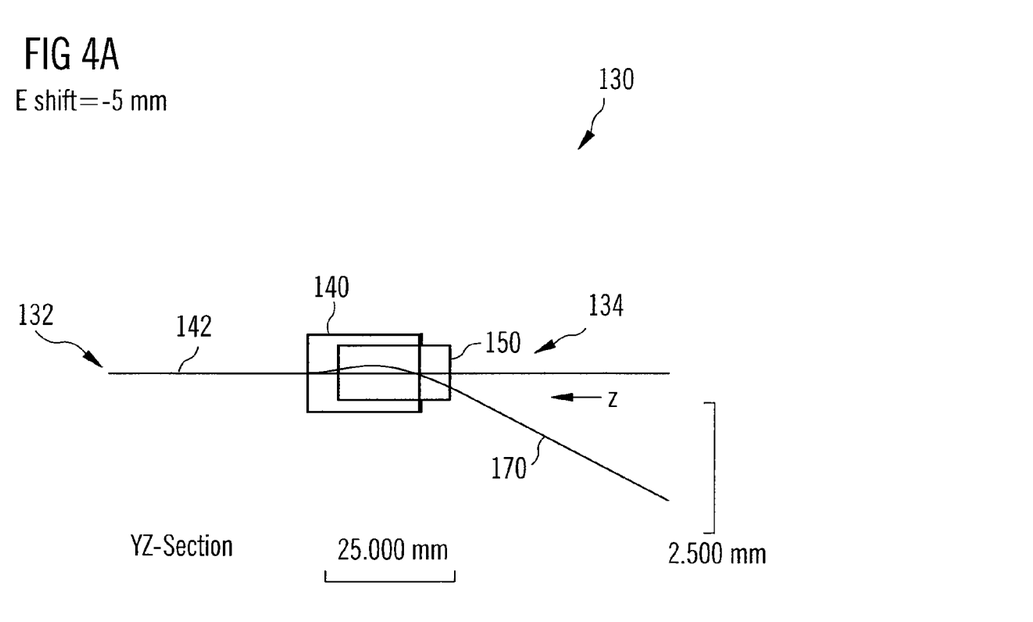
FIGS. 4A to 4C schematically illustrate an achromatic beam splitter, a corresponding beam bundle shape and a result of a Fourier analysis of the beam bundle deformation after passage through the beam splitter of an embodiment.
Figure 4B:
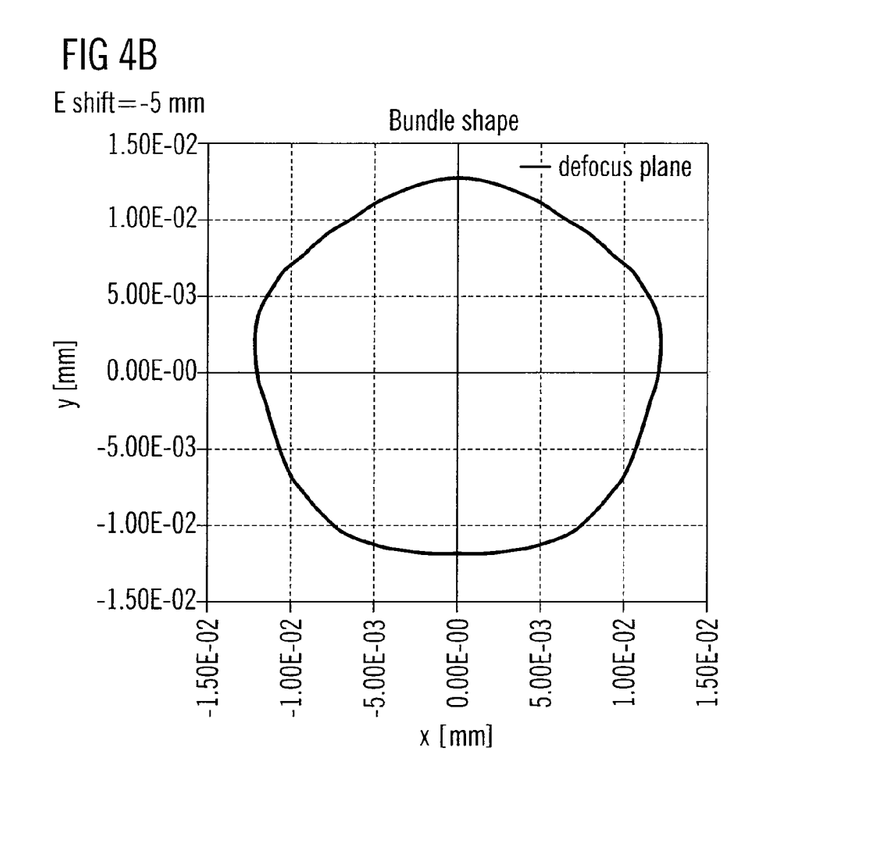
Figure 4C:
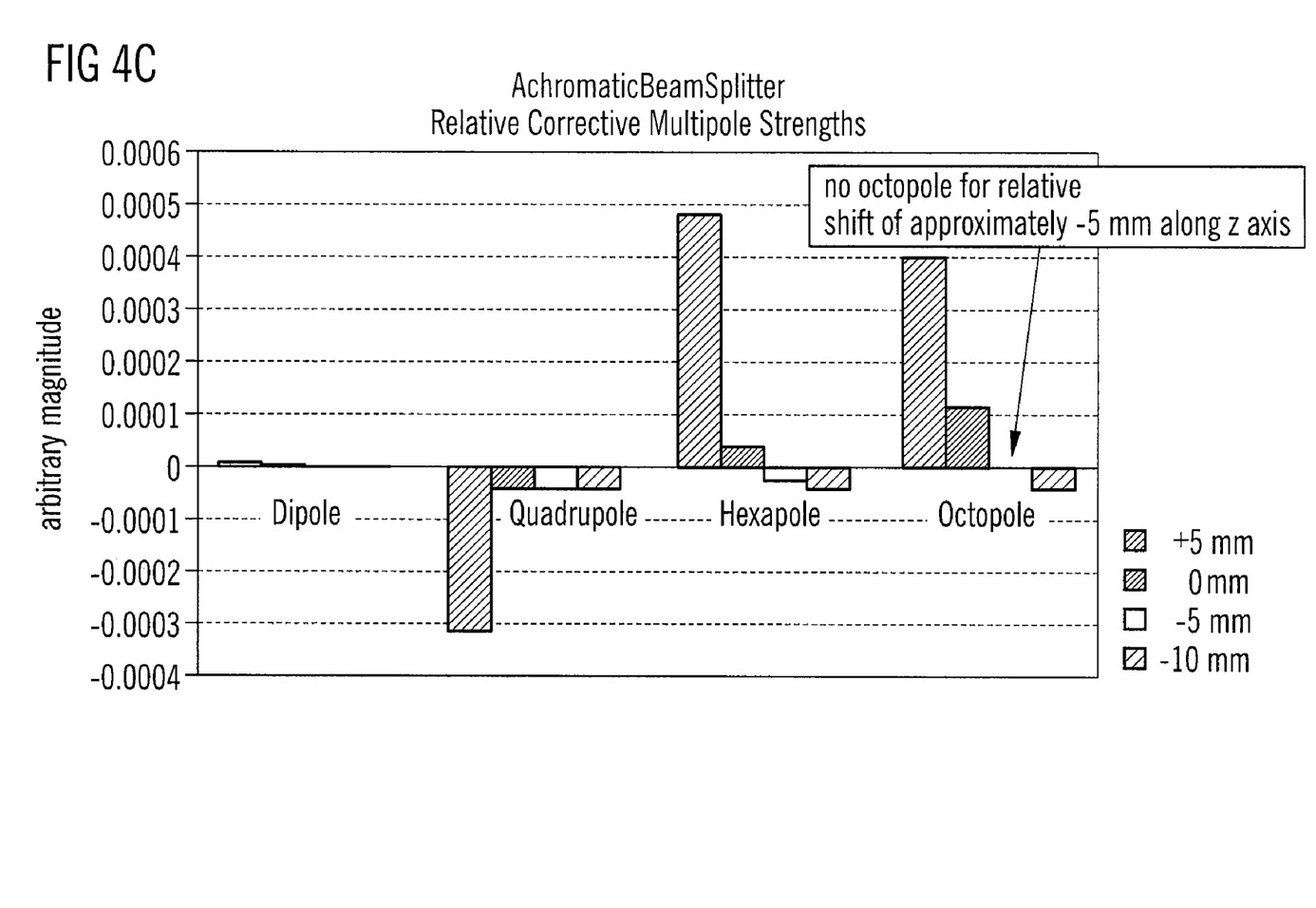

According to one embodiment, the electric field and the magnetic field, e.g. the centre of the electric field and the centre of the magnetic field, are offset with respect to each other along the z-axis of the achromatic beam deflector or achromatic beam separator. An example of this embodiment is schematically illustrated in FIGS. 4A to 4C as beam splitter 130. As indicated in FIG. 4A, the beam splitter has a beam outlet 132 and a beam inlet 134 (the position of both roughly indicated in the Figures by arrows). The present embodiment provides an axial shift of 5 mm of the electrostatic deflection field relative to the magnetic deflection field towards the beam outlet 132 of the beam splitter 130. An axial shift of the electrostatic deflection field towards the beam outlet 132 of the beam splitter 130 is denoted in the Figures as a negative shift, e.g. in FIG. 4A as −5 mm.

The effect of the present embodiment on the shape of the primary beam bundle entering the achromatic beam splitter 130 of FIG. 4A is presented in FIG. 4B, showing that the fourfold aberration illustrated in FIG. 3B is minimized. This effect is based on the specific relative positions of the electrostatic and magnetic deflection fields 140, 150 created by the present embodiment. The offset of the electric field 140 and the magnetic field 150 provided by this embodiment allows that the primary beam bundle shortly crosses the z-axis, i.e. the optical axis, and is then brought back to the optical axis, as shown in FIG. 4A. Therefore, the bundle experiences the effect of the octopole potential on both sides of the optical axis. As can be seen in FIG. 3C, the octopole potential changes sign between the left and the right side, i.e. along the x-axis. Therefore, since in the present embodiment a proper balance is established between the optical path, which is traveled by the primary beam bundle left from the z-axis, to the optical path, which is traveled by the primary beam bundle right from the z-axis, an undesired octopole influence can be minimized. In other words, the present embodiment allows an overshooting of the primary beam bundle about the z-axis, which is used to compensate an undesired octopole influence on the beam bundle. In some examples of embodiments, this overshooting can be created by shifting the electrostatic deflection field, also called electrostatic dipole field, towards the beam outlet of the beam separator.

In embodiments, which can be combined with any other embodiment described herein, the relative axial offset or shift of the electrostatic and magnetic deflection fields can be provided by shifting the electrostatic deflector element along the z-axis towards the beam outlet of the beam separator. The resulting relative shift of the electrostatic deflection field can be expressed by a shift of the centre of the electrostatic deflection field in a range of e.g. between 0% to about 50% of the field dimension extending in parallel to the z axis.

FIG. 4C shows the result of a Fourier analysis of the primary beam bundle deformation after passage through the beam splitter of the embodiment as shown in FIG. 4A for different values of the axial shift between the electrostatic field 140 and the fixed magnetic field 150. As can be seen, according to the present embodiment, the octopole aberration changes sign when the shift value is varied from +5 mm to −10 mm. The octopole aberration is compensated or even substantially cancelled by a shift of approximately −5 mm for the beam splitter shown in FIG. 4A.

In some embodiments, which can be combined with any other embodiment described herein, at least one element chosen from the electrostatic deflection element and the magnetic deflection element is adapted to provide the electric field and the magnetic field in an arrangement in which at least one element chosen from the electric field and the magnetic field, e.g. at least one element chosen from the centre of the electric field and the centre of the magnetic field, is offset with respect to the optical axis. Due to the resulting mechanical spacing between the constituent deflection fields, fourfold aberrations are avoided. In some examples of embodiments, which can be combined with any other embodiment described herein, at least one element chosen from the centre of the electric field and the centre of the magnetic field is offset laterally and/or perpendicularly to the optical axis.

Figure 5A:
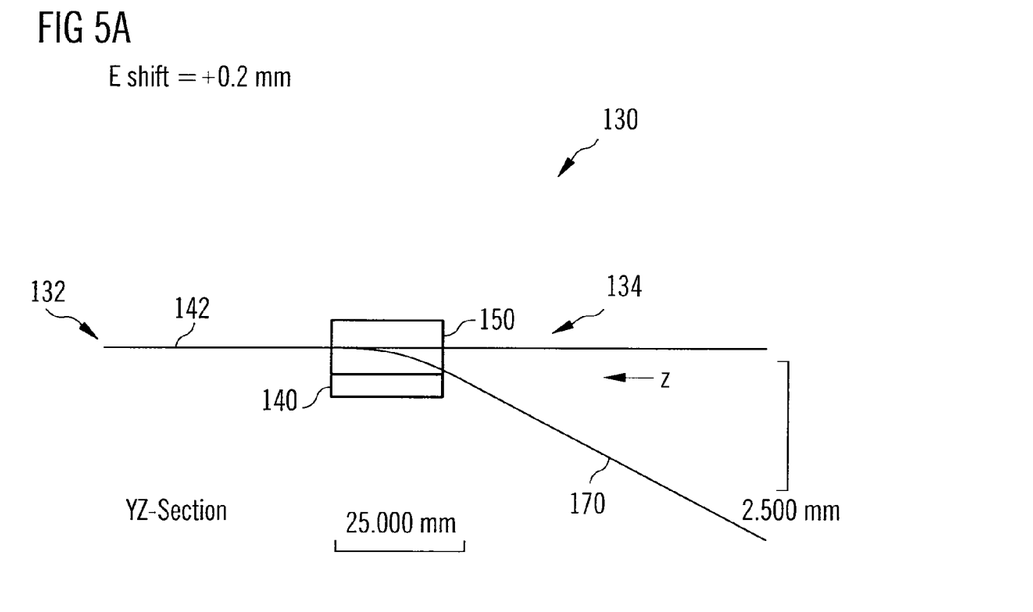
FIGS. 5A to 5C schematically illustrate an achromatic beam splitter, a corresponding beam bundle shape and a result of a Fourier analysis of the beam bundle deformation after passage through the beam splitter of an embodiment.
Figure 5B:
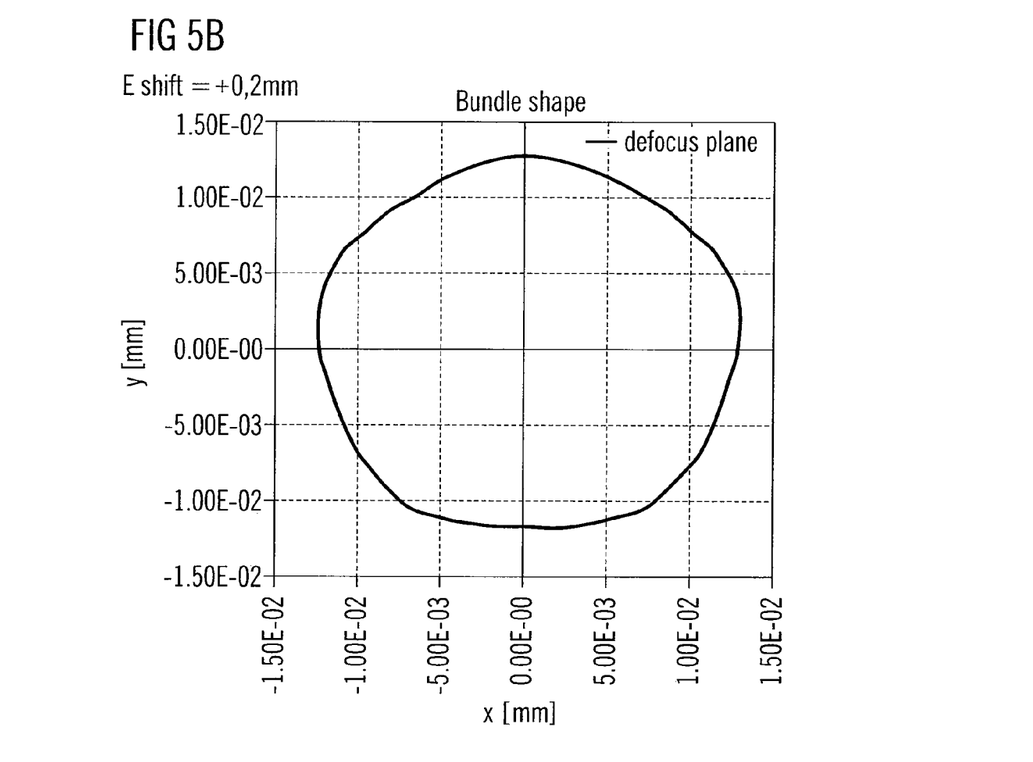

One example of embodiments including an offset of at least one element chosen from the centre of the electric field 140 and the centre of the magnetic field 150 with respect to the optical axis is shown in FIG. 5A. The present embodiment provides a shift of 0.2 mm of the electrostatic deflection field 140 relative to the magnetic deflection field 150 towards the direction of the incident primary beam bundle 170 entering the beam outlet 132 of the beam splitter 130. A shift of the electrostatic field 140 towards the incident primary beam 170 is denoted in the Figures as a positive shift, e.g. in FIG. 5A as 0.2 mm. As is seen from FIG. 5B, showing the resulting primary beam bundle shape, the fourfold aberration illustrated in FIG. 3B is minimized by the present embodiment.

In further embodiments, which can be combined with any other embodiment described herein, the lateral offset or shift of the electrostatic and/or magnetic deflection fields can be provided by mechanically shifting the electrostatic deflector element and/or the magnetic deflector element laterally, e.g. perpendicularly, with respect to the axis, e.g. the z-axis, of the beam separator. In some embodiments, the relative shift of the electrostatic deflection field can be expressed by a shift of the centre of the electrostatic deflection field in a range of between 0% to about 25% of the field dimension extending in the direction of the incident primary beam, e.g. 0% to about 7% of the field dimension.

Figure 5C:
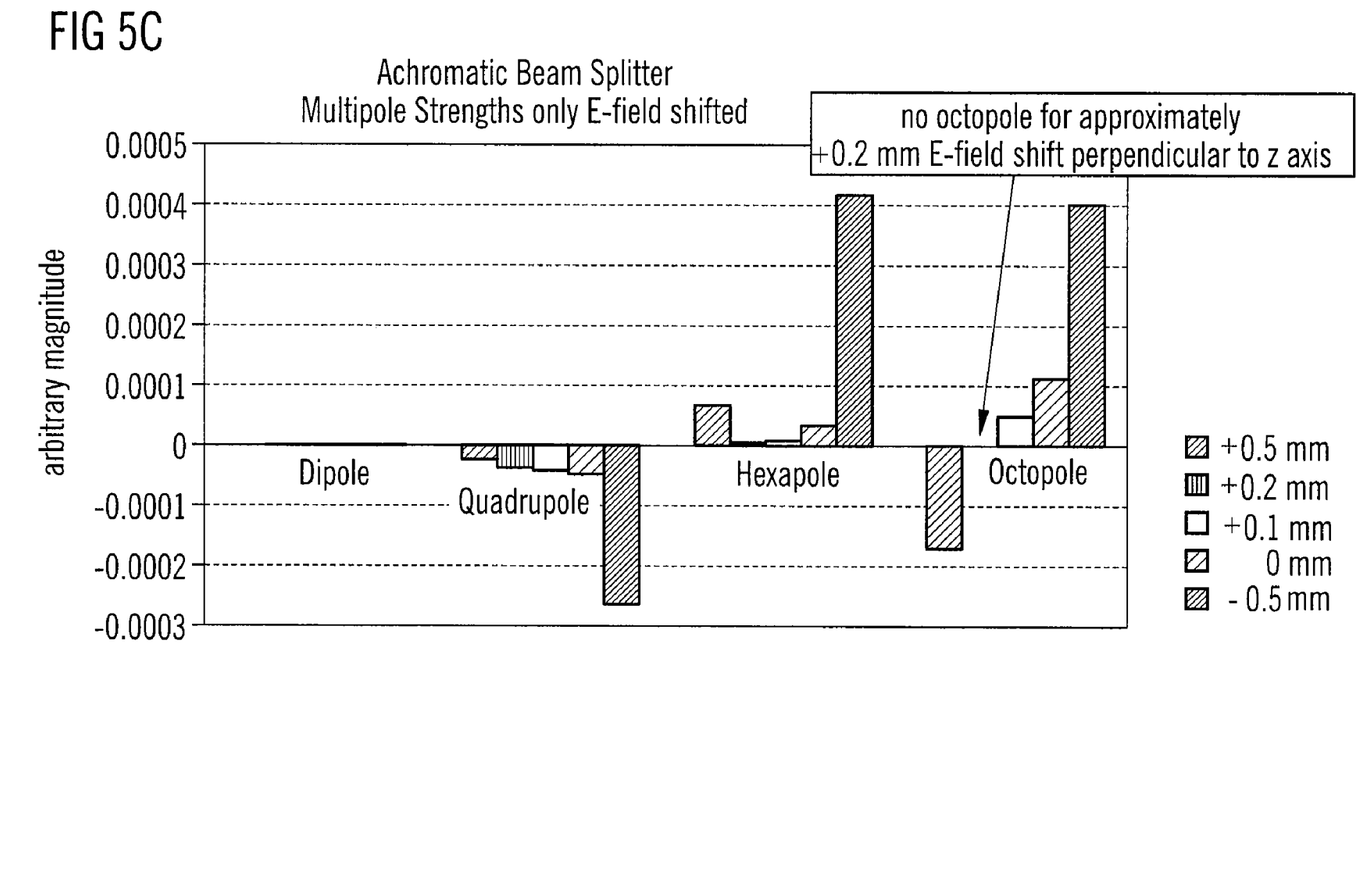

FIG. 5C shows the result of a Fourier analysis of the primary beam bundle deformation after passage through the beam splitter of the embodiment as shown in FIG. 5A for different values of the lateral shift between the electrostatic field and the fixed magnetic field. As can be seen, the octopole aberration changes sign when the shift value is varied from +0.5 mm to −0.5 mm. The octopole aberration is compensated or even substantially cancelled by a lateral electrostatic field shift of approximately 0.2 mm for the beam splitter shown in FIG. 5A. Hence, compensation of an undesired octopole influence can be achieved by laterally shifting the electrostatic dipole field with respect to the optical axis, e.g. towards the direction of the incident primary beam bundle 170.

In some embodiments, the axis of the beam deflector/separator can be the optical axis of an objective lens of a charged particle beam device in which the beam deflector/separator is used.

According to embodiments, which can be combined with any other embodiment described herein, the electrical field is provided substantially at or at least partially at the magnetic field and both fields are offset with respect to the optical axis. According to further embodiments, which can be combined with any other embodiment described herein, the centre of the electrical field is provided substantially at the centre of the magnetic field and both centres are offset with respect to the optical axis. For instance, the magnetic deflection element and the electrostatic deflection element can be provided in a Wien filter, and the Wien filter is offset laterally to the optical axis, e.g. towards the direction of the incident primary beam bundle 170.

The reason why, according to some embodiments, shifting only the electrostatic field laterally with respect to the optical axis can be sufficient for avoiding fourfold aberrations is as follows: According to embodiments, the magnetic deflection field can be generated by relatively large magnetic excitation coils. Hence, the space filled by a homogeneous magnetic deflection field is relatively large compared to the space traveled by the primary beam bundle. In such a design, the electrostatic field, on the other hand, can be generated by deflection plates with only a small distance to each other. Therefore, the such generated electrostatic field is less homogeneous and the resulting octopole effect is dominated by the contribution of the electrostatic field. Further, since, according to embodiments, the magnetic field is much more homogeneous than the electric (electrostatic) field, providing an offset of both fields commonly with respect to the axis, e.g. the optical axis, of the beam deflector/separator can also result in minimization of an undesired octopole influence. Hence, in case that the magnetic deflection element and the electrostatic deflection element are provided in a Wien filter, minimization of an octopole influence causing e.g. an aberration can be easily achieved by a small lateral displacement of the Wien filter.

As mentioned above, the primary charged particle bundle experiences the effect of the decapole field as a variety of different influences. Hence, in some embodiments, which can be combined with any other embodiment described herein, a potential offset, a dipole component, and a quadrupole component of the decapole field can be controlled by alignment, refocusing and stigmation, and/or a hexapole component of the decapole field can be controlled e.g. by a hexapole stigmator.

According to further embodiments, a charged particle beam device is provided, including at least one element chosen from an achromatic beam deflector device and an achromatic beam separator device according to any embodiment described herein. For instance, in the charged particle beam device, the achromatic beam separator device can be adapted to separate a primary charged particle beam of the charged particle beam device from a signal charged particle beam of the charged particle beam device, the charged particle device having an objective lens element with an objective optical axis corresponding to the optical axis of the beam separator device. In some embodiments, the charged particle beam device is at least one element chosen from a scanning charged particle beam device, an ion beam device, an electron beam device, an electron beam inspection device and an SEM.

In one embodiment, an achromatic beam separator device is provided, including an achromatic beam deflector device according to any embodiment described herein. In further embodiments, the achromatic beam deflector device or achromatic beam separator device of any embodiment described herein can be used for separating a primary charged particle beam of a charged particle beam device from a signal charged particle beam of the charged particle beam device, the charged particle beam device having an objective lens element with an objective optical axis corresponding to the optical axis of the beam deflector device. In further embodiments, the achromatic beam deflector device of any embodiment described herein can be used as a beam separator or beam splitter.

Embodiments described herein allow for deflecting a primary charged particle beam, e.g. a primary charged particle beam which is at least partially travelling off-axis of a charge particle beam device, onto an optical axis while avoiding fourfold aberrations. Further, embodiments provide a beam deflector or a beam separator, which is substantially free of fourfold aberrations, such as caused by an octopole potential, which is e.g. created by the beam deflector or beam separator itself. This avoids the need for additional correction elements and the associated control electronics and thus results in a significant simplification and cost reduction of the charged particle beam system. Further, embodiments described herein enable high current/high resolution imaging without the need for additional optical aberration correction elements.

According to one embodiment, an achromatic beam deflector device for deflecting a primary charged particle beam and providing the primary charged particle beam on an optical axis is provided, including a primary charged particle beam inlet, a primary charged particle beam outlet encompassing the optical axis, a magnetic deflection element adapted to generate a magnetic field, and an electrostatic deflection element adapted to generate an electric field overlapping the magnetic field, wherein at least one element chosen from the electrostatic deflection element and the magnetic deflection element is positioned and/or positionable to compensate an octopole influence.

In a further embodiment, an achromatic beam separator device for separating a primary charged particle beam from another charged particle beam and providing the primary charged particle beam on an optical axis, includes a primary charged particle beam inlet, a primary charged particle beam outlet encompassing the optical axis, a magnetic deflection element adapted to generate a magnetic field, and an electrostatic deflection element adapted to generate an electric field overlapping the magnetic field, wherein at least one element chosen from the electrostatic deflection element and the magnetic deflection element is positioned and/or positionable to compensate an octopole influence.

In one embodiment, which can be combined with any other embodiment described herein, at least one element chosen from the electrostatic deflection element and the magnetic deflection element is positioned and/or positionable to provide the electric field and the magnetic field in at least one arrangement chosen from: an arrangement in which the electric field and the magnetic field are offset with respect to each other, and an arrangement in which at least one element chosen from the electric field and the magnetic field is offset with respect to the optical axis.

In one embodiment, which can be combined with any other embodiment described herein, at least one element chosen from the electrostatic deflection element and the magnetic deflection element is positioned and/or positionable to provide the electric field and the magnetic field in at least one arrangement chosen from: an arrangement wherein the electric field and the magnetic field are offset with respect to each other in parallel to the optical axis, an arrangement wherein the electric field and the magnetic field are offset with respect to each other along the optical axis, and an arrangement wherein the electric field is offset with respect to the magnetic field in a direction towards the beam outlet.

In one embodiment, which can be combined with any other embodiment described herein, at least one element chosen from the electrostatic deflection element and the magnetic deflection element is positioned and/or positionable to provide the electric field and the magnetic field in at least one arrangement chosen from: an arrangement wherein at least one element chosen from the electric field and the magnetic field is offset laterally to the optical axis, and an arrangement wherein at least one element chosen from the electric field and the magnetic field is offset perpendicularly to the optical axis.

In further embodiments, which can be combined with any other embodiment described herein, the incident primary charged particle beam or at least a part of the incident primary charged particle beam can have an angle of incidence of less than 90° into the beam inlet. In further embodiments, which can be combined with any other embodiment described herein, at least one element chosen from the electrostatic deflection element and the magnetic deflection element can be positioned and/or positionable to provide the electric field and the magnetic field in at least one arrangement chosen from: an arrangement in which at least one element chosen from the electric field and the magnetic field is offset with respect to each other and/or with respect to the optical axis in a direction included in a plane defined by the optical axis and the incident primary beam; an arrangement in which the electrical field is laterally offset with respect to the optical axis towards the direction of the incident primary beam; and an arrangement in which the electrical field is offset with respect to the magnetic field.

In one embodiment, which can be combined with any other embodiment described herein, the electrical field is provided substantially at the magnetic field and both fields are offset with respect to the optical axis. In embodiments, which can be combined with any other embodiment described herein, at least one element chosen from the electrostatic deflection element and the magnetic deflection element is positioned and/or positionable to provide the electric field and the magnetic field in an arrangement in which the electrical field is provided substantially at the magnetic field and both fields are offset with respect to the optical axis.

In one embodiment, which can be combined with any other embodiment described herein, the magnetic deflection element and the electrostatic deflection element are provided in a Wien filter, and the Wien filter is offset laterally to the optical axis.

In further embodiments, which can be combined with any other embodiment described herein, the electrical field has a centre and the magnetic field has a centre, and the offset of the electrical field and/or the offset of the magnetic field is provided by an offset of the centre of the respective field.

In another embodiment, a charged particle beam device is provided, including at least one element chosen from an achromatic beam deflector device and an achromatic beam separator device, the deflector device and separator device each including a primary charged particle beam inlet, a primary charged particle beam outlet encompassing the optical axis, a magnetic deflection element adapted to generate a magnetic field, and an electrostatic deflection element adapted to generate an electric field overlapping the magnetic field, wherein at least one element chosen from the electrostatic deflection element and the magnetic deflection element is positioned and/or positionable to compensate an octopole influence.

In one embodiment, which can be combined with any other embodiment described herein, the achromatic beam separator device is adapted to separate a primary charged particle beam of the charged particle beam device from a signal charged particle beam of the charged particle beam device, the charged particle beam device having an objective lens element with an objective optical axis corresponding to the optical axis of the beam separator device.

In one embodiment, which can be combined with any other embodiment described herein, the charged particle beam device is at least one element chosen from a scanning charged particle beam device, an ion beam device, an electron beam device, an electron beam inspection device and an SEM.

According to a yet further embodiment, a method of operating an achromatic beam deflector device for deflecting a primary charged particle beam and providing the primary charged particle beam on an optical axis is provided, the method including providing a magnetic field, providing an electric field overlapping the magnetic field, wherein at least one element chosen from the electric field and the magnetic field is provided in a position to compensate an octopole influence.

In another embodiment, a method of operating an achromatic beam separator device for separating a primary charged particle beam from another charged particle beam and providing the primary charged particle beam on an optical axis is provided, the method including providing a magnetic field, providing an electric field overlapping the magnetic field, wherein at least one element chosen from the electric field and the magnetic field is provided in a position to compensate an octopole influence.

According to embodiments, which can be combined with any other embodiment described herein, the electric and magnetic fields can be generated on the optical axis, e.g. encompassing the optical axis.

In one embodiment, which can be combined with any other embodiment described herein, the electric field and the magnetic field are provided in at least one arrangement chosen from: an arrangement in which the electric field and the magnetic field are offset with respect to each other, and an arrangement in which at least one element chosen from the electric field and the magnetic field is offset with respect to the optical axis.

In further embodiments, which can be combined with any other embodiment described herein, the achromatic beam deflector device is an achromatic beam deflector device according to any embodiment described herein and the achromatic beam separator device is an achromatic beam separator device according to any embodiment described herein.

According to a further embodiment, at least one element chosen from an achromatic beam deflector device according to any embodiment described herein, achromatic beam separator device according to any embodiment described herein, and charged particle beam device according to any embodiment described herein is used in a method of probing and/or structuring of a specimen.

According to a yet further embodiment, a method of probing of a specimen is provided, wherein probing of the specimen is performed using at least one element chosen from an achromatic beam deflector device according to any embodiment described herein, an achromatic beam separator device according to any embodiment described herein, and a charged particle beam device according to any embodiment described herein. According to a yet further embodiment, a method of structuring of a specimen is provided, wherein structuring of the specimen is performed using at least one element chosen from an achromatic beam deflector device according to any embodiment described herein, an achromatic beam separator device according to any embodiment described herein, and a charged particle beam device according to any embodiment described herein.

The written description uses examples to disclose the invention, including the best mode, and also to enable any person skilled in the art to make and use the invention. While the invention has been described in terms of various specific embodiments, those skilled in the art will recognize that the invention can be practiced with modifications within the spirit and scope of the claims. Especially, mutually non-exclusive features of the examples of embodiments and embodiments or modifications thereof described above may be combined with each other. The patentable scope of the invention is defined by the claims, and may include other examples that occur to those skilled in the art. Such other examples are intended to be within the scope of the claims.

While the foregoing is directed to embodiments of the invention, other and further embodiments of the invention may be devised without departing from the basic scope thereof, and the scope thereof is determined by the claims that follow.

What is claimed is:

1. An achromatic beam deflector device for deflecting a primary charged particle beam and providing the primary charged particle beam on an optical axis, comprising:
    a primary charged particle beam inlet;
    a primary charged particle beam outlet encompassing the optical axis;
    a magnetic deflection element adapted to generate a magnetic field; and an electrostatic deflection element adapted to generate an electric field overlapping the magnetic field, wherein at least one element chosen from the electrostatic deflection element and the magnetic deflection element is positioned to provide the electric field and the magnetic field in at least one arrangement chosen from:
- an arrangement in which the electric field is laterally offset with respect to the optical axis towards the direction of the incident primary beam, and
- an arrangement wherein the electric field is offset with respect to the magnetic field in a direction towards the beam outlet, wherein the at least one element is adjusted such that a trajectory of a primary charged particle beam bundle experiences an equal amount of positive and negative octopole effect about the optical axis.

2. An achromatic beam separator device for separating a primary charged particle beam from another charged particle beam and providing the primary charged particle beam on an optical axis, comprising:
- a primary charged particle beam inlet;
- a primary charged particle beam outlet encompassing the optical axis;
- a magnetic deflection element adapted to generate a magnetic field; and
- an electrostatic deflection element adapted to generate an electric field overlapping the magnetic field, wherein at least one element chosen from the electrostatic deflection element and the magnetic deflection element is positioned to provide the electric field and the magnetic field in at least one arrangement chosen from:
  - an arrangement in which the electric field is laterally offset with respect to the optical axis towards the direction of the incident primary beam, and
  - an arrangement wherein the electric field is offset with respect to the magnetic field in a direction towards the beam outlet, wherein the at least one element is adjusted such that a trajectory of a primary charged particle beam bundle experiences an equal amount of positive and negative octopole effect about the optical axis.

3. The device claim 1, wherein at least one element chosen from the electrostatic deflection element and the magnetic deflection element is positioned or positionable to provide the electric field and the magnetic field in at least one arrangement chosen from:
- an arrangement in which the electric field and the magnetic field are offset with respect to each other, and
- an arrangement in which at least one element chosen from the electric field and the magnetic field is offset with respect to the optical axis.

4. The device claim 2, wherein at least one element chosen from the electrostatic deflection element and the magnetic deflection element is positioned or positionable to provide the electric field and the magnetic field in at least one arrangement chosen from:
- an arrangement in which the electric field and the magnetic field are offset with respect to each other, and
- an arrangement in which at least one element chosen from the electric field and the magnetic field is offset with respect to the optical axis.

5. The device of claim 1, wherein at least one element chosen from the electrostatic deflection element and the magnetic deflection element is positioned or positionable to provide the electric field and the magnetic field in at least one arrangement chosen from:
- an arrangement wherein the electric field and the magnetic field are offset with respect to each other in parallel to the optical axis, and
- an arrangement wherein the electric field and the magnetic field are offset with respect to each other along the optical axis.

6. The device of claim 2, wherein at least one element chosen from the electrostatic deflection element and the magnetic deflection element is positioned or positionable to provide the electric field and the magnetic field in at least one arrangement chosen from:
- an arrangement wherein the electric field and the magnetic field are offset with respect to each other in parallel to the optical axis, and
- an arrangement wherein the electric field and the magnetic field are offset with respect to each other along the optical axis.

7. The device of claim 1, wherein at least one element chosen from the electrostatic deflection element and the magnetic deflection element is positioned or positionable to provide the electric field and the magnetic field in at least one arrangement chosen from:
- an arrangement wherein the magnetic field is offset laterally to the optical axis, and
- an arrangement wherein at least one element chosen from the electric field and the magnetic field is offset perpendicularly to the optical axis.

8. The device of claim 2, wherein at least one element chosen from the electrostatic deflection element and the magnetic deflection element is positioned or positionable to provide the electric field and the magnetic field in at least one arrangement chosen from:
- an arrangement wherein the magnetic field is offset laterally to the optical axis, and
- an arrangement wherein at least one element chosen from the electric field and the magnetic field is offset perpendicularly to the optical axis.

9. The device of claim 1, wherein the device is adapted to have the incident primary charged particle beam or at least a part of the incident primary charged particle beam have an angle of incidence of less than 90° into the beam inlet.

10. The device of claim 1, wherein at least one element chosen from the electrostatic deflection element and the magnetic deflection element is positioned or positionable to provide the electric field and the magnetic field in at least one arrangement chosen from:
- an arrangement in which at least one element chosen from the electric field and the magnetic field is offset with respect to each other and with respect to the optical axis in a direction included in a plane defined by the optical axis and the incident primary beam;
- an arrangement in which at least one element chosen from the electric field and the magnetic field is offset with respect to each other or with respect to the optical axis in a direction included in a plane defined by the optical axis and the incident primary beam; and
- an arrangement in which the electric field is offset with respect to the magnetic field.

11. The device of claim 2, wherein the device is adapted to have the incident primary charged particle beam or at least a part of the incident primary charged particle beam have an angle of incidence of less than 90° into the beam inlet.

12. The device of claim 2, wherein at least one element chosen from the electrostatic deflection element and the magnetic deflection element is positioned or positionable to provide the electric field and the magnetic field in at least one arrangement chosen from:

an arrangement in which at least one element chosen from the electric field and the magnetic field is offset with respect to each other and with respect to the optical axis in a direction included in a plane defined by the optical axis and the incident primary beam;

an arrangement in which at least one element chosen from the electric field and the magnetic field is offset with respect to each other or with respect to the optical axis in a direction included in a plane defined by the optical axis and the incident primary beam; and an arrangement in which the electric field is offset with respect to the magnetic field.

13. The device of claim 1, wherein at least one element chosen from the electrostatic deflection element and the magnetic deflection element is positioned or positionable to provide the electric field and the magnetic field in an arrangement in which the electric field is provided substantially at the magnetic field and both fields are offset with respect to the optical axis.

14. The device of claim 2, wherein at least one element chosen from the electrostatic deflection element and the magnetic deflection element is positioned or positionable to provide the electric field and the magnetic field in an arrangement in which the electric field is provided substantially at the magnetic field and both fields are offset with respect to the optical axis.

15. The device of claim 1, wherein the electric field has a centre and the magnetic field has a centre, and wherein an offset of the electric field and an offset of the magnetic field is provided by an offset of the centre of the respective field.

16. The device of claim 2, wherein the electric field has a centre and the magnetic field has a centre, and wherein an offset of the electric field and an offset of the magnetic field is provided by an offset of the centre of the respective field.

17. A charged particle beam device, comprising:
at least one element chosen from an achromatic beam deflector device and an achromatic beam separator device, wherein the achromatic beam deflector device is for deflecting a primary charged particle beam and providing the primary charged particle beam on an optical axis, and wherein the achromatic beam separator device is for separating a primary charged particle beam from another charged particle beam and providing the primary charged particle beam on an optical axis, wherein the achromatic beam deflector device and the achromatic beam separator device each comprises:
a primary charged particle beam inlet;
a primary charged particle beam outlet encompassing the optical axis;
a magnetic deflection element adapted to generate a magnetic field; and
an electrostatic deflection element adapted to generate an electric field overlapping the magnetic field, wherein at least one element chosen from the electrostatic deflection element and the magnetic deflection element is positioned to provide the electric field and the magnetic field in at least one arrangement chosen from:
an arrangement in which the electric field is laterally offset with respect to the optical axis towards the direction of the incident primary beam, and
an arrangement wherein the electric field is offset with respect to the magnetic field in a direction towards the beam outlet, wherein the at least one element is adjusted such that a trajectory of a primary charged particle beam bundle experiences an equal amount of positive and negative octopole effect about the optical axis.

18. The charged particle beam device of claim 17, wherein the charged particle beam device is at least one element chosen from a scanning charged particle beam device; an ion beam device; an electron beam device; an electron beam inspection device; an SEM; and a charged particle beam device wherein the achromatic beam separator device is adapted to separate a primary charged particle beam of the charged particle beam device from a signal charged particle beam of the charged particle beam device, the charged particle beam device having an objective lens element with an objective optical axis corresponding to the optical axis of the beam separator device.

19. A method of operating an achromatic beam deflector device for deflecting a primary charged particle beam and providing the primary charged particle beam on an optical axis or of operating an achromatic beam separator device for separating a primary charged particle beam from another charged particle beam and providing the primary charged particle beam on an optical axis, the method comprising:
providing a magnetic field; and
providing an electric field overlapping the magnetic field, wherein the electric field and the magnetic field are provided in at least one arrangement chosen from:
an arrangement in which the electric field is laterally offset with respect to the optical axis towards the direction of the incident primary beam; and
an arrangement wherein the electric field is offset with respect to the magnetic field in a direction towards the beam outlet, wherein at least one of the electric field and the magnetic field is adjusted such that a trajectory of a primary charged particle beam bundle experiences an equal amount of positive and negative octopole effect about the optical axis.

20. The method of claim 19, wherein the electric field and the magnetic field are provided in an arrangement in which at least one element chosen from the electric field and the magnetic field is offset with respect to the optical axis.

21. The method of claim 19, wherein the achromatic beam deflector device or the achromatic beam separator device comprises:
a primary charged particle beam inlet;
a primary charged particle beam outlet encompassing the optical axis;
a magnetic deflection element adapted to generate a magnetic field; and
an electrostatic deflection element adapted to generate an electric field overlapping the magnetic field, wherein at least one element chosen from the electrostatic deflection element and the magnetic deflection element is positioned to provide the electric field and the magnetic field in at least one arrangement chosen from:
an arrangement in which the electric field is laterally offset with respect to the optical axis towards the direction of the incident primary beam; and
an arrangement wherein the electric field is offset with respect to the magnetic field in a direction towards the beam outlet, wherein the at least one element is adjusted such that a trajectory of a primary charged particle beam bundle experiences an equal amount of positive and negative octopole effect about the optical axis.

22. A method of probing and/or structuring of a specimen, wherein the method is performed in a charged particle beam device comprising at least one element chosen from an achromatic beam deflector device and an achromatic beam separator device; wherein the achromatic beam deflector device is for deflecting a primary charged particle beam and providing the primary charged particle beam on an optical axis, and wherein the achromatic beam separator device is for separating a primary charged particle beam from another charged particle beam and providing the primary charged particle beam on an optical axis; wherein the achromatic beam deflector device and the achromatic beam separator device each comprises:
- a primary charged particle beam inlet;
- a primary charged particle beam outlet encompassing the optical axis;
- a magnetic deflection element adapted to generate a magnetic field; and
- an electrostatic deflection element adapted to generate an electric field overlapping the magnetic field, at least one element chosen from the electrostatic deflection element and the magnetic deflection element is positioned to provide the electric field and the magnetic field in at least one arrangement chosen from:
  - an arrangement in which the electric field is laterally offset with respect to the optical axis towards the direction of the incident primary beam; and
  - an arrangement wherein the electric field is offset with respect to the magnetic field in a direction towards the beam outlet, wherein the at least one element is adjusted such that a trajectory of a primary charged particle beam bundle experiences an equal amount of positive and negative octopole effect about the optical axis.

* * * * *